United States Patent [19]

Hirayama

[11] Patent Number: 5,225,693
[45] Date of Patent: Jul. 6, 1993

[54] CMOS GATE ARRAY CONFIGURED AS A SRAM WITH LOAD RESISTORS OVER GATE ELECTRODES

[75] Inventor: Teruo Hirayama, Kanagawa, Japan

[73] Assignee: Sony Corporation, Tokyo, Japan

[21] Appl. No.: 652,772

[22] Filed: Feb. 8, 1991

[30] Foreign Application Priority Data

Feb. 9, 1990 [JP] Japan .................. 2-30918

[51] Int. Cl.[5] ............. H01L 27/10; H01L 29/04; H01L 27/02
[52] U.S. Cl. ................. 257/204; 257/211; 257/369; 257/381; 257/904
[58] Field of Search ............ 357/59 F, 42, 45, 51; 365/154

[56] References Cited

U.S. PATENT DOCUMENTS 4,541,006  9/1985  Ariizumi et al. ............. 357/23.7
4,862,241  8/1989  Ashida et al. ............... 357/42

FOREIGN PATENT DOCUMENTS 0029099  5/1981  European Pat. Off. .
0131463  1/1985  European Pat. Off. .

OTHER PUBLICATIONS

IEEE Journal of Solid-State Circuits, "A 0/8-μm CMOS Technology for High-Performance ASIC Memory and Channelless Gate Array", Apr. 1989, No. 2, pp. 380–387.

Primary Examiner—Rolf Hille
Assistant Examiner—Robert Limanek
Attorney, Agent, or Firm—Hill, Steadman & Simpson

[57] ABSTRACT

In a semiconductor memory serving as an SRAM mounted on a CMOS gate array, a memory cell is constituted by a pair of transistors of a first conductivity type channel and a pair of transistors of a second conductivity type channel of the CMOS gate array and load resistances formed on the gate electrodes of the pair of transistors of the first conductivity type channel. Although the CMOS gate array is used, a memory cell area is small and a large capacity can be easily obtained.

6 Claims, 6 Drawing Sheets

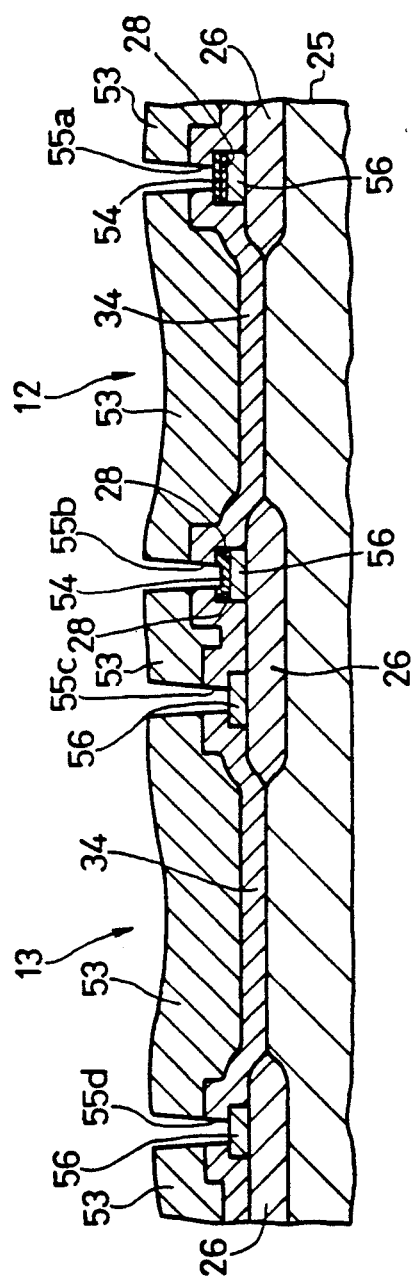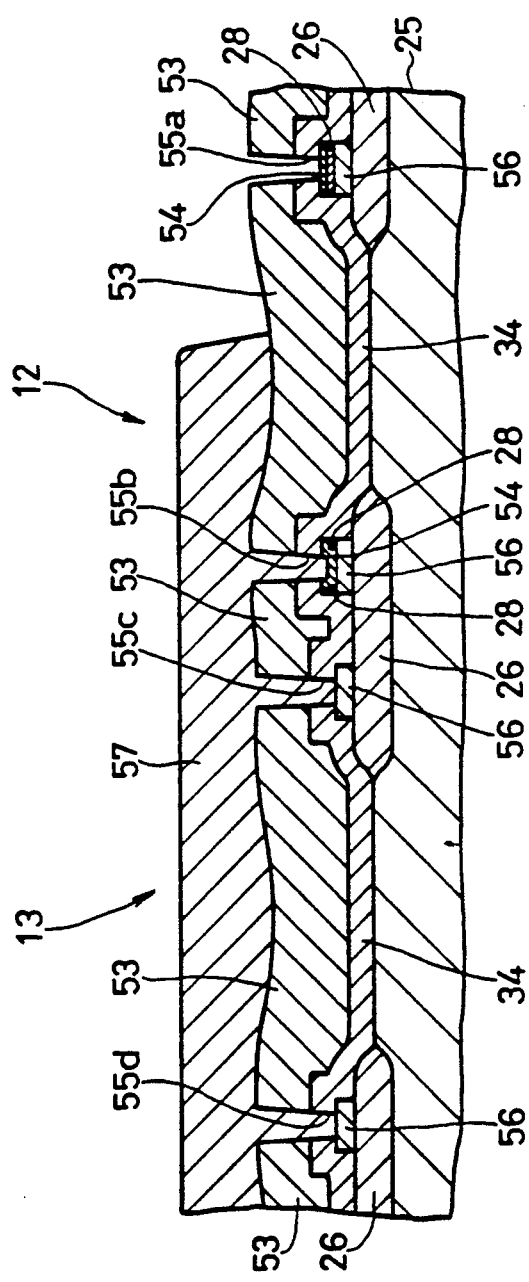

CMOS GATE ARRAY CONFIGURED AS A SRAM WITH LOAD RESISTORS OVER GATE ELECTRODES

BACKGROUND OF THE INVENTION

1. Field of the Invention

The present invention relates to a semiconductor memory serving as an SRAM mounted on a CMOS gate array.

2. Description of the Prior Art

When an SRAM is to be mounted on a CMOS gate array, a full CMOS SRAM is conventionally constructed. Therefore, when a CMOS gate array shown in FIG. 1 is used, one memory cell is constituted by a unit cell consisting of four n-channel transistors, four p-channel transistors and a substrate contact portion.

Note that the two p-channel transistors of the unit cell of the CMOS gate array are left unused.

However, when eight transistors, i.e., two pairs of n-channel transistors and two pairs of p-channel transistors are occupied for one memory cell as described above, a memory cell area is too large to obtain a large capacity.

OBJECTS AND SUMMARY OF THE INVENTION

It is, therefore, an object of the present invention to provide a semiconductor memory having a small memory cell area and capable of easily obtaining a large capacity in spite of using a CMOS gate array.

In a semiconductor memory according to the present invention, only a pair of transistors of a first conductivity type channel and a pair of transistors of a second conductivity type channel are used as transistors for constituting one memory cell.

In addition, since load resistances of a flip-flop are formed on the gate electrodes of the pair of transistors of the first conductivity type channel, no exclusive region is necessary for the load resistances.

As described above, only a pair of transistors of a first conductivity type channel and a pair of transistors of a second conductivity type channel are used as transistors for constituting one memory cell, and no exclusive region is necessary for load resistances. Therefore, in a semiconductor memory according to the present invention, although a CMOS gate array is used, a memory cell area is small, and a large capacity can easily be obtained.

DETAILED DESCRIPTION OF A PREFERRED EMBODIMENT

An embodiment of the present invention will be described below with reference to FIGS. 1 to 4.

Figure 4:
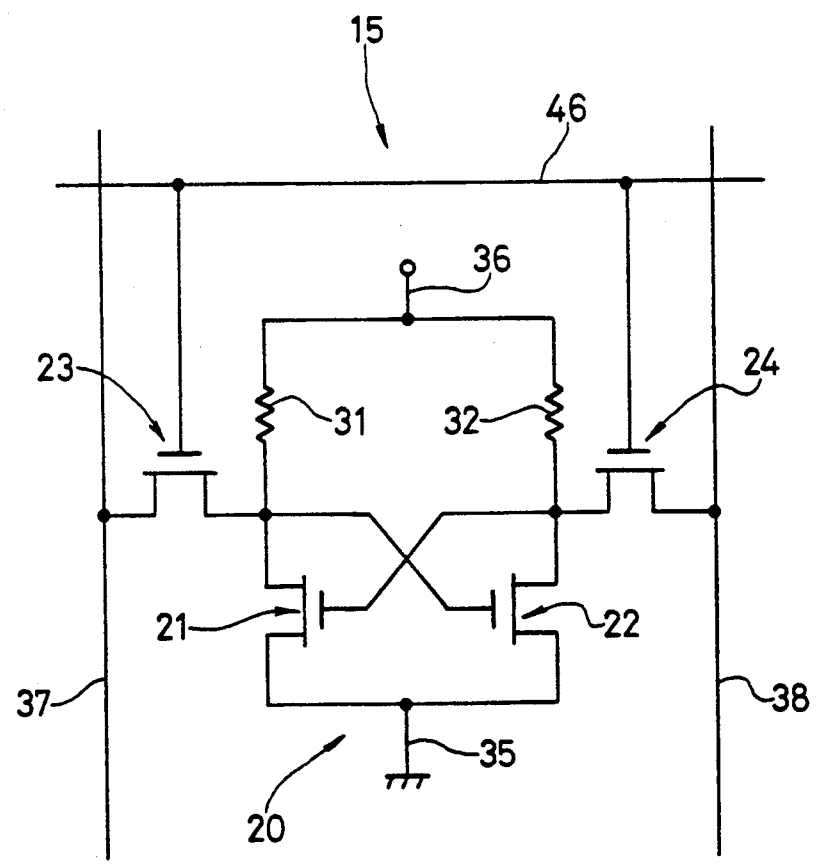
FIG. 4 is a circuit diagram showing an equivalent circuit of a memory cell of a resistance load MOS SRAM to which the present invention can be applied.

According to this embodiment, a resistance load MOS SRAM having a memory cell shown in FIG. 4 is mounted on a CMOS gate array.

Figure 1:
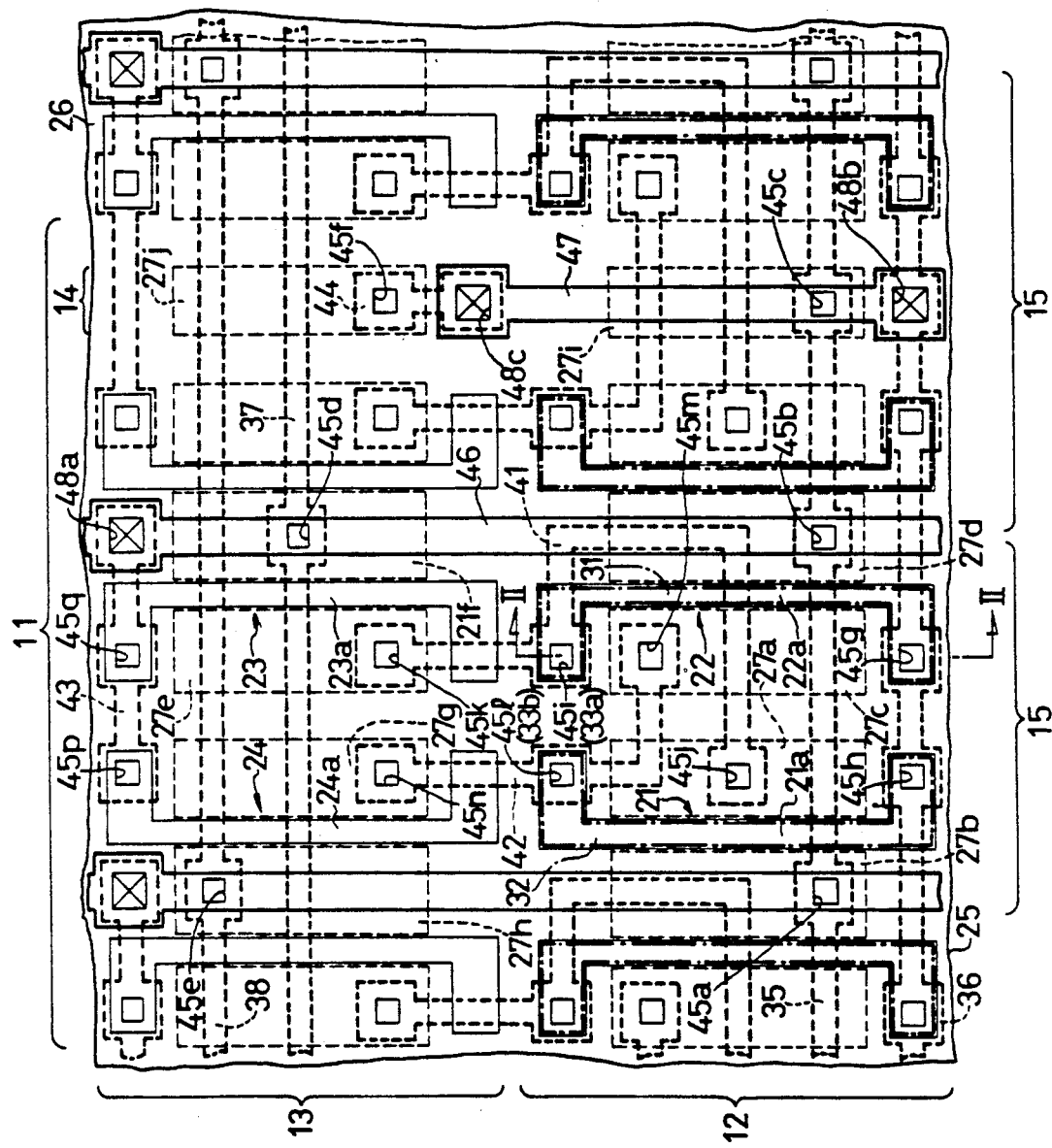
FIG. 1 is a plan view of a memory cell portion according to an embodiment of the present invention.

FIG. 1 shows a memory cell portion of the CMOS gate array. A unit cell 11 of the CMOS gate array of the memory cell portion comprises an n-channel transistor portion 12, a p-channel transistor portion 13 and a substrate contact portion 14. Two memory cells 15 are arranged to have the same area as that of one unit cell 11.

Driver transistors 21 and 22 for a flip-flop 20 consist of n-channel transistors, and transfer transistors 23 and 24 consist of p-channel transistors.

Impurity regions 27a to 27h serving as source/drain regions of the transistors 21 to 24 are formed in a region surrounded by a LOCOS film 26 in a semiconductor substrate 25.

Gate electrodes 21a to 24a of the transistors 21 to 24 are formed on an insulating film (not shown) on the semiconductor substrate 25 by a first layer polycrystalline Si film.

Load resistances 31 and 32 having the same patterns as those of the gate electrodes 22a and 21a are formed on an insulating interlayer 28 (FIG. 2) on the gate electrodes 22a and 21a by a second layer polycrystalline Si film. The load resistances 31 and 32 are respectively connected to the gate electrodes 22a and 21a via contact holes 33a and 33b formed in the insulating interlayer 28.

The load resistances 31 and 32 and the gate electrodes 23a and 24a and the like are covered with an insulating interlayer 34 (FIG. 2), and a ground line 35, a power source line 36, bit lines 37 and 38 and wirings 41 to 44 are formed on the insulating interlayer 34 by a first layer Al film.

The ground line 35, the bit lines 37 and 38 and the wiring 44 are connected to impurity regions 27b, 27d, 27i, 27f, 27h and 27j via contact holes 45a to 45f formed in an insulating film under these lines, respectively. The power source line 36 is connected to the load resistances 31 and 32 via contact holes 45g and 45h.

The wiring 41 connects the load resistance 31 to the impurity regions 27a and 27e via contact holes 45i to 45k, and the wiring 42 connects the load resistance 32 to the impurity regions 27c and 27g via contact holes 45l to 45n. The wiring 43 connects the gate electrodes 23a and 24a to each other via contact holes 45o and 45p.

The first layer Al film constituting the ground line 35 and the like is covered with another insulating interlayer (not shown), and a word line 46 and a wiring 47 are formed on the insulating interlayer by a second layer Al film.

The word line 46 is connected to the wiring 43 via a contact hole 48a formed in the above insulating interlayer. The wiring 47 connects the power source line 36 to the wiring 44 via contact holes 48b and 48c.

FIGS. 2A to 2G show steps of manufacturing the load resistance 31 and the power source line 36 and the wiring 41 connected to the load resistance 31. Note that, for illustrative convenience in FIGS. 2A to 2G, an Al film is omitted except for portions near the contact holes 45g and 45i.

Figure 2A:
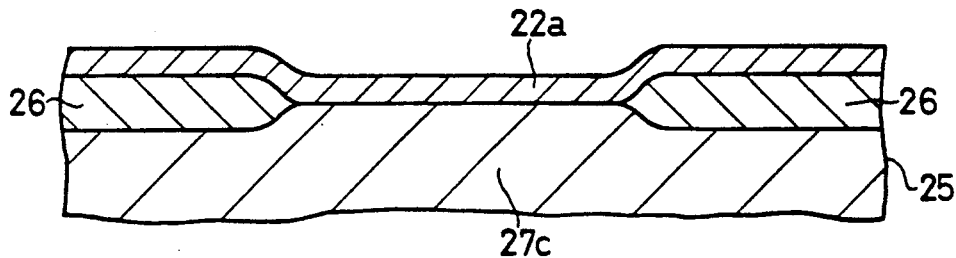
FIGS. 2A and 2G are schematic sectional side views sequentially showing manufacturing steps for the memory cell portion along a line II—II in FIG. 1.

In this manufacturing step, as shown in FIG. 2A, the LOCOS film 26 is formed on the surface of the semiconductor substrate 25, and the first layer polycrystalline Si film for forming the gate electrode 22a and the like is deposited on the semiconductor substrate 25.

Figure 2B:
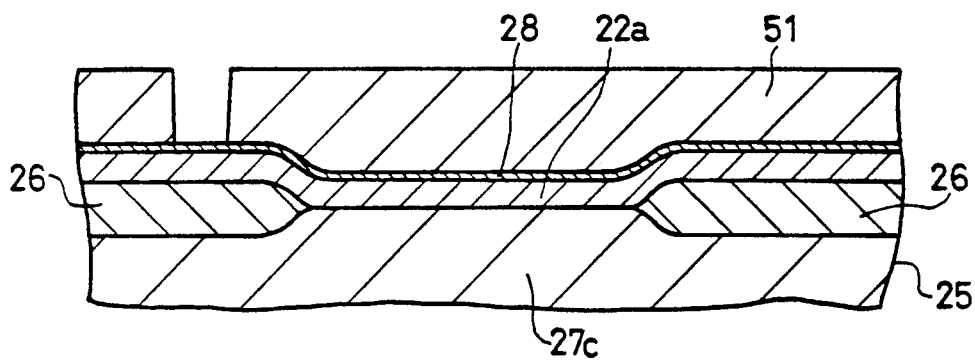

As shown in FIG. 2B, the insulating interlayer 28 is formed on the first layer polycrystalline Si film, and a resist 51 for forming the contact hole 33a is patterned.

Figure 2C:
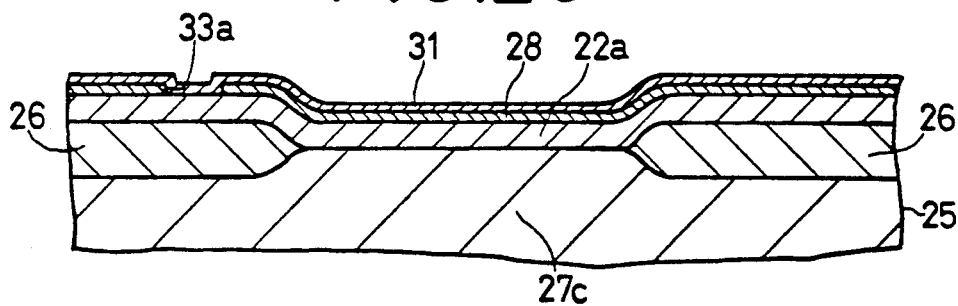

As shown in FIG. 2C, the contact hole 33a is formed in the insulating interlayer 28 using the resist 51, and the second layer polycrystalline Si film for forming the load resistance 31 and the like is deposited on the resultant structure. Immediately after this deposition, the second layer polycrystalline Si film is removed from the p-channel transistor portion 13 by using a resist (not shown).

Figure 2D:
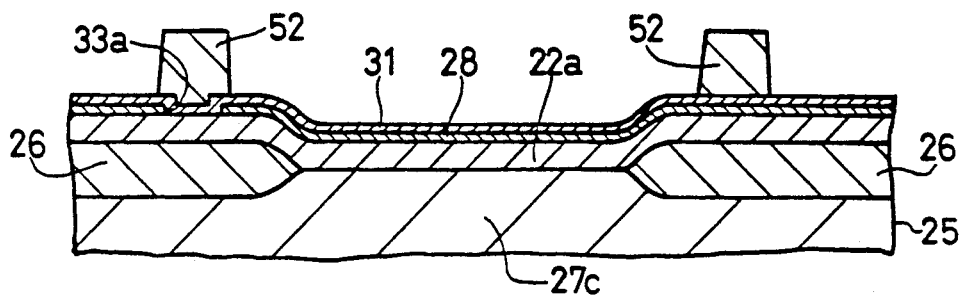

As shown in FIG. 2D, a resist 52 is patterned to have the pattern for the gate electrodes 21a to 24a.

Figure 2E:
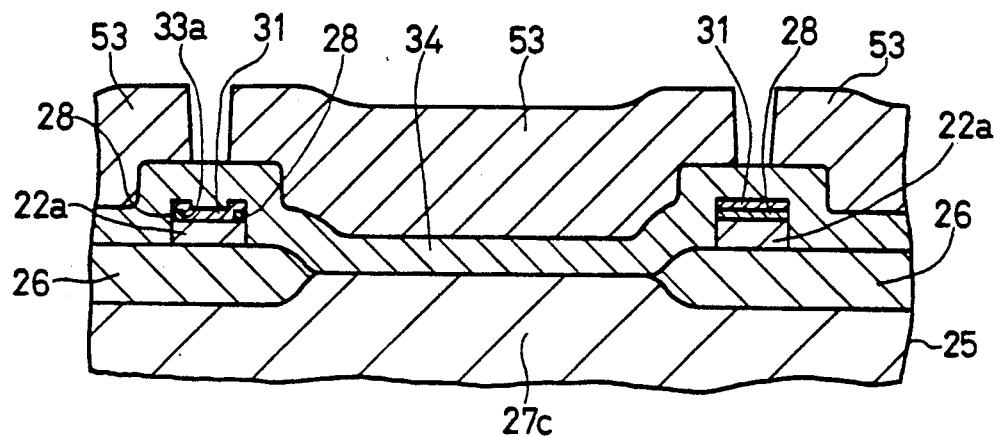

As shown in FIG. 2E, after the second layer polycrystalline Si film, the insulating interlayer 28 and the first layer polycrystalline Si film are sequentially etched using the resist 52, the insulating interlayer 34 is formed. When a CMOS gate array is manufactured, this state is generally preserved as master slice.

Figure 2F:
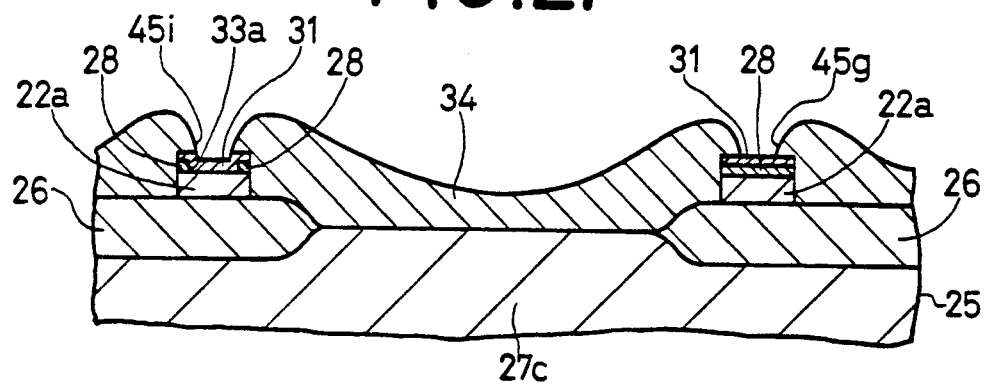

A resist 53 for forming the contact holes 55g, 45i and the like is patterned, and, as shown in FIG. 2F, the contact holes 45g, 45i and the like are formed using the resist 53 and the insulating interlayer 34 is reflowed.

Figure 2G:
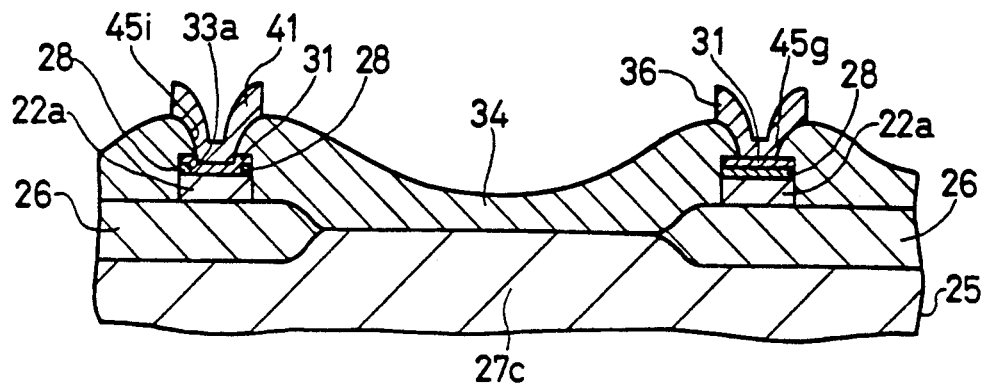

As shown in FIG. 2G, the power source line 36, the wiring 41 and the like are formed by the first layer Al film, and wirings by a second layer Al film (not shown) and the subsequent wirings are formed. Thereafter, a passivation film (not shown) is formed on the resultant structure, thereby completing the SRAM.

Although the above description with reference to FIGS. 2A to 2G has been made for the transistor 22, the transistor 21 is manufactured in the same manner as described above at the same time.

A part of the master slice used as an SRAM is manufactured as described in FIGS. 2A to 2G. In a portion in which the second layer polycrystalline Si film is not used, it may be considered that the first layer Al film serving as a power source line must be connected to the first layer polycrystalline Si film.

Figure 3C:
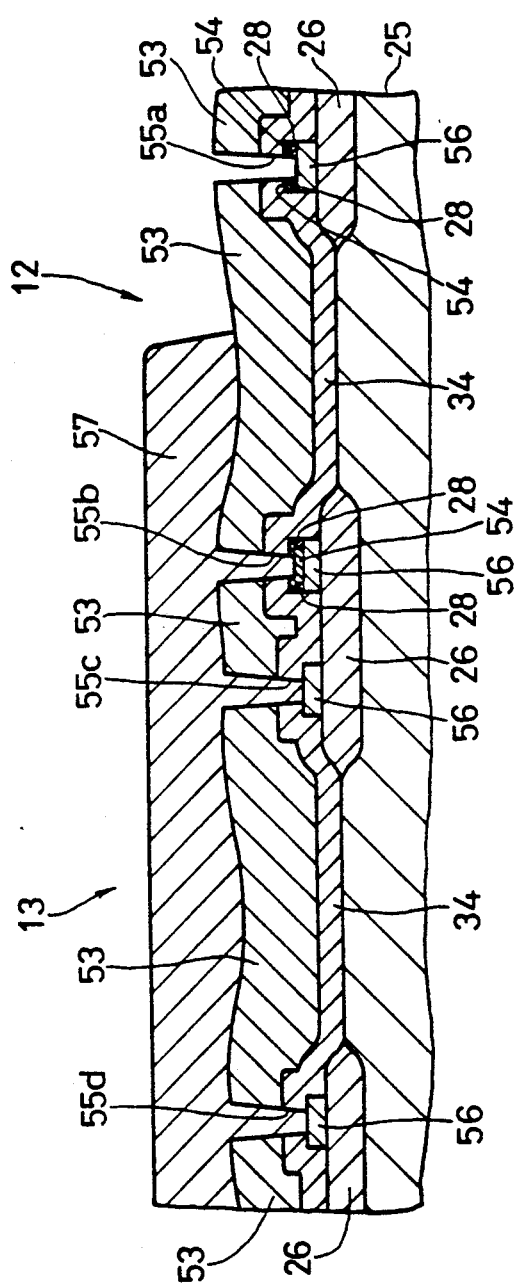
FIGS. 3A and 3D are sectional views sequentially showing manufacturing steps for another portion according to the embodiment of the present invention.

FIGS. 3A to 3D show steps of manufacturing this portion. That is, as shown in FIG. 3A, the insulating interlayer 34 is etched using the resist 53 to form contact holes 55a and 55b reaching a second layer polycrystalline Si film 54 in the n-channel transistor portion 12 and to form contact holes 55c and 55d reaching a first layer polycfystalline Si film 56 in the p-channel transistor portion 13.

As shown in FIG. 3B, a resist 57 is patterned to expose only a portion near the contact hole 55a to be connected to the power source line.

As shown in FIG. 3C, the polycrystalline Si film 54 and the insulating interlayer 28 in the contact hole 55a are etched using the resists 53 and 57.

Figure 3D:
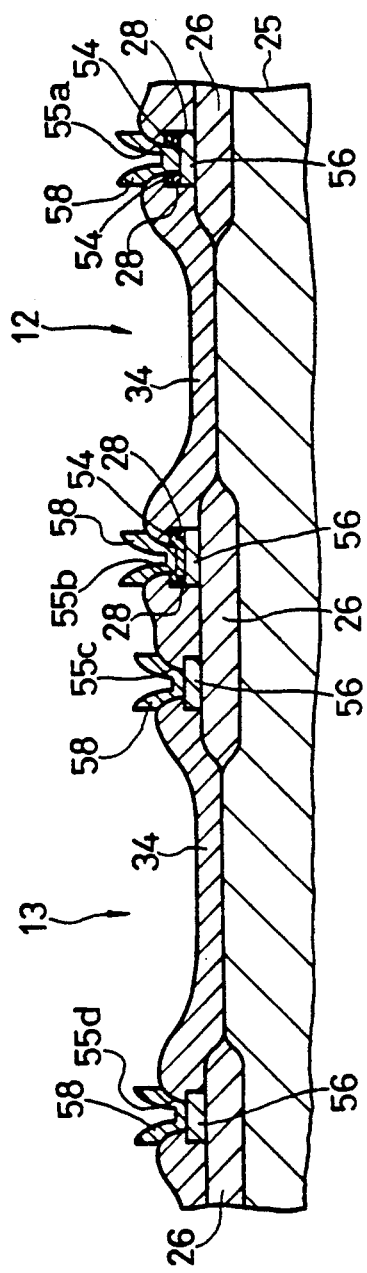

Thereafter, as shown in FIG. 3D, the resists 53 and 57 are removed, and the insulating interlayer 34 is reflowed. The first layer Al film 58 is patterned to form the power source line or other wirings.

What is claimed is:

1. A semiconductor memory in which a memory cell is constituted by a flip-flop and transfer transistors, wherein:

a pair of transistors of a first conductivity type channel of a CMOS gate array are driver transistors for said flip-flop, load resistances of the flip-flop are formed on gate electrodes of said pair of transistors of the first conductivity type channel, and a pair of transistors of a second conductivity type channel of said CMOS gate array are said transfer transistors.

2. A semiconductor memory according to claim 1, wherein said gate electrodes and said load resistances are patterned into the same pattern formed using the same mask.

3. A semiconductor memory according to claim 1, wherein said semiconductor memory is manufactured using said CMOS gate array in which said load resistances are patterned and covered with an insulating interlayer.

4. A semiconductor memory according to claim 1, wherein said gate electrodes and said load resistances are respectively formed by first and second semiconductor films consisting of different layers.

5. A semiconductor memory according to claim 4, wherein said second semiconductor film is removed from a portion in which said transistors of the second conductivity type channel are formed.

6. A semiconductor memory according to claim 4, wherein a contact hole reaching said first semiconductor film through said second semiconductor film is formed in a portion except for said memory cell.

* * * * *